(12) United States Patent
Dierickx et al.

(10) Patent No.: US 9,819,882 B2
(45) Date of Patent: Nov. 14, 2017

(54) GLOBAL SHUTTER HIGH DYNAMIC RANGE SENSOR

(71) Applicant: Caeleste CVBA, Mechelen (BE)

(72) Inventors: Bart Dierickx, Edegem (BE); Jiaqi Zhu, Antwerp (BE); Ajit Kumar Kalgi, Berchem (BE); Qiang Yao, Antwerp (BE); Koen Liekens, Berchem (BE); Gaozhan Cai, Antwerp (BE); Bert Luyssaert, Ghent (BE); Dirk Van Aken, Aartselaar (BE); Peng Gao, Korbeek-Lo (BE)

(73) Assignee: CAELESTE CVBA, Mechelen (BE)

( * ) Notice: Subject to any disclaimer, the term of this patent is extended or adjusted under 35 U.S.C. 154(b) by 0 days.

(21) Appl. No.: 15/173,905

(22) Filed: Jun. 6, 2016

(65) Prior Publication Data

US 2016/0360127 A1 Dec. 8, 2016

Related U.S. Application Data

(60) Provisional application No. 62/171,468, filed on Jun. 5, 2015.

(51) Int. Cl.
*H04N 5/355* (2011.01)
*H04N 5/359* (2011.01)
(Continued)

(52) U.S. Cl.
CPC ..... *H04N 5/3559* (2013.01); *H01L 27/14609* (2013.01); *H01L 27/14656* (2013.01);
(Continued)

(58) Field of Classification Search
CPC ............. H04N 5/37452; H04N 5/3559; H04N 5/37457; H04N 5/374; H04N 5/363;
(Continued)

(56) References Cited

U.S. PATENT DOCUMENTS 5,625,210 A   4/1997   Lee et al.
6,522,357 B2*  2/2003   Beiley ................... H04N 5/353
                                                    250/208.1
(Continued)

FOREIGN PATENT DOCUMENTS

EP       2107610 A2     10/2009

OTHER PUBLICATIONS

Solhusvik et al., "A 1280×960 3.75um Pixel CMOS Imager with Triple Exposure HDR", Aptina Imaging, 4 Pages.
(Continued)

*Primary Examiner* — Michael Osinski
(74) *Attorney, Agent, or Firm* — Workman Nydegger

(57) ABSTRACT

The present invention provides a pixel circuit comprising a pinned photodiode, at least one first transfer gate for electrically connecting the pinned photodiode to at least one storage node and at least one further transfer gate. The at least one further gate can connect the at least one storage node with at least one floating diffusion node. At least one merging switch is included for allowing connection between the at least one floating diffusion node with one or more capacitor nodes, which can accept charge that exceeds the maximum storage capacity of the storage node.

20 Claims, 6 Drawing Sheets

(51) Int. Cl.
*H04N 5/3745* (2011.01)
*H01L 27/146* (2006.01)

(52) U.S. Cl.
CPC ....... *H04N 5/3592* (2013.01); *H04N 5/37452* (2013.01); *H01L 27/14654* (2013.01)

(58) Field of Classification Search
CPC ...... H04N 5/353; H04N 5/335; H04N 5/3592; H04N 5/3741; H04N 5/2327; H04N 5/2355; H04N 5/347; H04N 5/35554; H04N 5/35563; H04N 5/357; H04N 5/3595; H04N 5/3743; H01L 27/14609; H01L 27/14603; H01L 27/14643; H01L 27/14641; H01L 27/14806; H01L 27/14612; H01L 27/14638; H01L 27/1463; H01L 27/14654; H01L 27/14601; H01L 27/14656
USPC ...................................................... 250/208.1
See application file for complete search history.

(56) References Cited

U.S. PATENT DOCUMENTS

| | | | | |
|---|---|---|---|---|
| 6,903,394 | B2* | 6/2005 | Agarwal | H04N 3/155 257/291 |
| 7,235,772 | B2* | 6/2007 | Ko | H01L 27/14609 250/208.1 |
| 7,531,858 | B2* | 5/2009 | Lee | H01L 27/14603 257/292 |
| 7,663,683 | B2* | 2/2010 | Miyatake | H01L 27/14609 348/300 |
| 7,697,051 | B2* | 4/2010 | Krymski | H01L 27/14609 250/208.1 |
| 7,728,892 | B2* | 6/2010 | Altice, Jr. | H01L 27/14603 250/208.1 |
| 7,800,673 | B2* | 9/2010 | Sugawa | H01L 27/14609 250/208.1 |
| 7,820,467 | B2* | 10/2010 | Sugawa | H01L 27/14603 257/233 |
| 7,884,402 | B2* | 2/2011 | Ki | H04N 5/3559 257/292 |
| 8,072,520 | B2* | 12/2011 | Rysinski | H04N 5/353 250/208.1 |
| 8,184,191 | B2* | 5/2012 | Sugawa | H04N 3/1568 257/290 |
| 8,253,810 | B2* | 8/2012 | Myers | H04N 5/23248 348/208.1 |
| 8,345,136 | B2* | 1/2013 | Song | H01L 27/14609 348/308 |
| 8,471,315 | B1 | 6/2013 | Hynecek et al. | |
| 8,471,940 | B2* | 6/2013 | Sa | H04N 5/35527 348/229.1 |
| 8,624,308 | B2* | 1/2014 | Oshikubo | H01L 27/14609 257/291 |
| 8,686,339 | B2* | 4/2014 | Mabuchi | H04N 5/363 250/208.1 |
| 8,723,284 | B1 | 5/2014 | Hynecek | |
| 8,816,266 | B2* | 8/2014 | Watanabe | H01L 27/14609 250/208.1 |
| 8,878,264 | B2* | 11/2014 | Velichko | H01L 21/26586 257/215 |
| 8,963,271 | B2* | 2/2015 | Yamazaki | H01L 27/14607 257/290 |
| 9,118,883 | B2* | 8/2015 | Wan | H04N 5/765 |
| 9,343,500 | B2* | 5/2016 | Mabuchi | H04N 5/363 |
| 9,438,840 | B2* | 9/2016 | Oike | H04N 5/363 |
| 9,549,099 | B2* | 1/2017 | Fan | H01L 27/14806 |
| 9,578,265 | B2* | 2/2017 | Roffet | H04N 5/3597 |
| 9,628,736 | B2* | 4/2017 | Suzuki | H04N 5/3559 |
| 9,674,468 | B2* | 6/2017 | Kobayashi | H04N 5/3591 |
| 2004/0218078 | A1* | 11/2004 | Lee | H01L 27/14603 348/308 |
| 2004/0239791 | A1 | 12/2004 | Mabuchi | |
| 2005/0083421 | A1 | 4/2005 | Berezin et al. | |
| 2005/0110093 | A1* | 5/2005 | Altice, Jr. | H01L 27/14609 257/359 |
| 2005/0110884 | A1* | 5/2005 | Altice, Jr. | H01L 27/14603 348/302 |
| 2005/0157194 | A1* | 7/2005 | Altice, Jr. | H04N 3/155 348/308 |
| 2006/0001061 | A1 | 1/2006 | Miyatake et al. | |
| 2006/0044243 | A1* | 3/2006 | Rysinski | H04N 5/37452 345/92 |
| 2006/0158542 | A1* | 7/2006 | Mizuno | G01J 1/46 348/308 |
| 2006/0219868 | A1 | 10/2006 | Morimoto et al. | |
| 2006/0243887 | A1* | 11/2006 | Boemler | H01L 27/14603 250/208.1 |
| 2006/0266922 | A1 | 11/2006 | McGrath et al. | |
| 2007/0013798 | A1* | 1/2007 | Ahn | H04N 5/335 348/308 |
| 2007/0035649 | A1* | 2/2007 | McKee | H01L 27/14609 348/308 |
| 2007/0096238 | A1 | 5/2007 | Oike et al. | |
| 2008/0018763 | A1* | 1/2008 | Sato | H04N 5/335 348/308 |
| 2009/0045319 | A1* | 2/2009 | Sugawa | H01L 27/14609 250/208.1 |
| 2009/0103827 | A1 | 4/2009 | Ladd et al. | |
| 2009/0108176 | A1* | 4/2009 | Blanquart | H04N 5/353 250/208.1 |
| 2009/0128677 | A1 | 5/2009 | Kozlowski | |
| 2009/0140305 | A1* | 6/2009 | Sugawa | H01L 27/14603 257/292 |
| 2009/0141155 | A1* | 6/2009 | Ellis-Monaghan | H04N 5/35527 348/308 |
| 2009/0190016 | A1 | 7/2009 | Iida | |
| 2009/0295973 | A1* | 12/2009 | Oshikubo | H04N 5/3559 348/311 |
| 2010/0188540 | A1 | 7/2010 | Bechtel et al. | |
| 2010/0230579 | A1* | 9/2010 | Watanabe | H01L 27/14609 250/208.1 |
| 2012/0002089 | A1 | 1/2012 | Wang et al. | |
| 2012/0132787 | A1* | 5/2012 | Mabuchi | H04N 5/363 250/208.1 |
| 2012/0132820 | A1 | 5/2012 | Iwakiri et al. | |
| 2012/0193516 | A1 | 8/2012 | Bogaerts | |
| 2012/0256077 | A1* | 10/2012 | Yen | H01L 27/14609 250/208.1 |
| 2012/0262616 | A1* | 10/2012 | Sa | H04N 5/3745 348/311 |
| 2012/0320245 | A1 | 12/2012 | Hasegawa et al. | |
| 2013/0175652 | A1* | 7/2013 | Yamazaki | H01L 27/14607 257/435 |
| 2014/0077062 | A1 | 3/2014 | Hynecek | |
| 2014/0085523 | A1 | 3/2014 | Hynecek | |
| 2014/0103411 | A1 | 4/2014 | Dai et al. | |
| 2014/0197301 | A1* | 7/2014 | Velichko | H01L 27/14625 250/208.1 |
| 2014/0263947 | A1 | 9/2014 | Dierickx | |
| 2014/0267855 | A1* | 9/2014 | Fan | H01L 27/14806 348/302 |
| 2014/0353472 | A1* | 12/2014 | Dierickx | H01L 27/14612 250/214 P |
| 2014/0367552 | A1 | 12/2014 | Hynecek et al. | |
| 2015/0146060 | A1* | 5/2015 | Suzuki | H04N 5/3559 348/300 |
| 2016/0316163 | A1* | 10/2016 | Beck | H04N 5/3559 |
| 2016/0366350 | A1* | 12/2016 | Roffet | H04N 5/3597 |
| 2017/0244921 | A1* | 8/2017 | Velichko | H04N 5/378 |

OTHER PUBLICATIONS

Darmont Methods to Extend the Dynamic Range of Snapshot Active Pixels Sensors, www.melexis.com, Electronic Imaging Proceedings, 2008, 12 Pages.

(56) References Cited

OTHER PUBLICATIONS

Hara et al., A Linear-Logarithmic CMOS Sensor with Offset Calibration Using an Injected Charge Signal, IEEE International Solid-State Circuits Conference, Feb. 8, 2005, 3 Pages.
Loose et al., "A Self-Calibrating Single-Chip CMOS Camera With Logarithmic Response", IEEE Journal of Solid-State Circuits, vol. 36, No. 4, Apr. 2001, pp. 586-596.
Sugawa et al., "A 100dB Dynamic Range CMOS Image Sensor Using a Lateral Overflow Integration Capacitor", IEEE International Solid-State Circuits Conference, Feb. 8, 2005, 3 Pages.
Belgian Search Report from Belgian Application No. 201505771, dated Oct. 18, 2016.

\* cited by examiner

GLOBAL SHUTTER HIGH DYNAMIC RANGE SENSOR

FIELD OF THE INVENTION

The invention relates to the field of image sensors. More specifically it relates to image pixels with global shutter and method of operation thereof.

BACKGROUND OF THE INVENTION

Particular types of radiation sensors work under the photoelectric effect. Impinging photons are converted into electrons and are integrated (collected) in sensor pixels. After a predetermined time period (e.g. a predetermined integration cycle), the collected charge is converted into a voltage (which may occur in the pixel itself, as in standard CMOS sensors), which is supplied to the output terminals of the sensor. The voltage may reach the output in analog or digital form. Pixels usually comprise a buffer amplifier (e.g. a source follower), which drives the sense lines that are connected to the pixels by suitable addressing transistors. After charge to voltage conversion is completed and the resulting signal transferred out from the pixels, the pixels are reset in order to be ready for accumulation of new charge. Floating diffusion (FD) and reset transistors may also be included for charge detection and removal of collected charge. The reset transistor usually produces thermal noise with can be reduced or removed via Correlated Double Sampling (CDS).

One of the disadvantages of standard CMOS sensors is the sequential pixel scanning, usually row by row, generating the "rolling shutter" artifact of exposure time skew (distortion of moving objects). Global shutter is a preferred method, which eliminates distortion. CCD image sensors usually work under global shutter, but they are generally more expensive than CMOS sensors and are more sensitive to saturation artifacts: when saturation is reached in a pixel, the charge may overflow to adjacent pixels, and an artifact (blooming) appears in the image. Also during charge transfer, if saturation is reached, the charges may flow into adjacent pixel columns, producing smearing artifacts. Saturation levels are determined by factors like the area, which is a constraint in compact and portable applications. CMOS are generally less sensitive to these artifacts. In order to implement global shutter in CMOS, all pixels are exposed at the same time to radiation, but an extra charge storage should be provided. The charge storages can then be read row by row, and the image does not present skew. There are examples of incorporation of global shutter to CMOS configurations, for example by transferring charge to registers. However, saturation has to be taken into account for the pixel and also for the charge storage. Some implementations include overflow barriers and doped regions which reduce blooming and remove the excess charge into the substrate, but the excess photocharges are then lost. Additionally, some of these solutions require complex gate control and additional switches, and transfer and readout times become large, making these systems less ideal for video applications and for fast image capture.

SUMMARY OF THE INVENTION

It is an object of embodiments of the present invention to provide good quality pixels, and a sensor comprising such good quality pixels. The pixels have high dynamic range.

In a first aspect, the present invention provides a pixel circuit comprising a pinned photodiode, at least one first transfer gate for electrically connecting the pinned photodiode to at least one storage node, at least one second transfer gate for electrically connecting the at least one storage node with at least one floating diffusion node, and at least one merging switch for connecting the at least one floating diffusion node with at least one capacitor node arranged for accepting charge that exceeds the maximum storage capacity of the storage node. It is not elaborated here, as it is well-known to persons skilled in the art, how the signal present on the floating diffusion (FD) of pixels is buffered or amplified for voltage or current readout and multiplexing. In a pixel circuit according to embodiments of the present invention, the at least one capacitor node is connected, over a barrier, either to the storage node or to the pinned photodiode.

It is an advantage of embodiments of the present invention that the principles of a global electronic shutter, capable of performing readout with CDS without being limited by the relatively high dark current of a surface diode, can be combined with linear high dynamic range, by creating multiple linear ranges of "charge at full well" ($Q_{FW}$ ranges).

The charge storage capacity of the pixel may be increased without increasing the area of the pixel. Further, blooming may be reduced.

The pixel circuit according to embodiments of the first aspect may further comprise at least one third transfer gate for electrically connecting the pinned photodiode and the at least one capacitor node.

It is an advantage of embodiments of the present invention that charges may be selectively overflown directly or indirectly from the PPD, allowing selectivity of $Q_{FW}$.

The pixel circuit according to embodiments of the first aspect may further comprise at least one fixed barrier between the pinned photodiode and the at least one capacitor node.

It is an advantage of embodiments of the present invention that the size of the circuit may be reduced by implementing the barrier via doping, deposition or patterning.

The pixel circuit according to embodiments of the first aspect may further comprise at least one third transfer gate for electrically connecting the storage node and the at least one capacitor node.

It is an advantage of embodiments of the present invention that PPD may be substantially emptied of charges and the overflow to the capacitor may be tuned, thus tuning the dynamic range, allowing different levels of sensitivity of the pixel for different illumination conditions.

The pixel circuit according to embodiments of the first aspect may further comprise at least one fixed barrier between the storage node and the at least one capacitor node.

It is an advantage of embodiments of the present invention that blooming into the FD may be reduced with avoiding using a further gate, reducing space and energy consumption.

In the pixel circuit according to embodiments of the first aspect, the merging switch may be a transistor gate that can be set to at least 2 DC levels.

It is an advantage of embodiments of the present invention that static gate control may be applied.

In the pixel circuit according to embodiments of the first aspect, the merging switch may be a merging transfer gate.

It is an advantage of embodiments of the present invention that standard transistor gates may be used, allowing easy manufacture.

In the pixel circuit according to embodiments of the first aspect, any or both of the first or second transfer gates can be set to at least 3 different levels comprising an OFF level, an ON level, and at least one intermediate level, wherein the transfer gate is an overflown variable barrier.

It is an advantage of embodiments of the present invention that dynamic gate control can be used by increasing or decreasing overflowing of the transfer gates into the storage node or capacitor node.

Also the merging transfer gate can be set to at least 3 different levels comprising an OFF level, an ON level, and an intermediate level wherein the transfer gate is an overflown variable barrier.

It is an advantage of embodiments of the present invention that capacitors in the capacitor node may be protected from overloading by overflow through the merging transfer gate to the floating diffusion node.

In the pixel circuit according to embodiments of the first aspect, the at least one capacitor node may comprise a pair of capacitors in parallel configuration, each capacitor connected to the capacitor node via a switch.

It is an advantage of embodiments of the present invention that overflow charges of odd and even integration times may be independently stored, allowing full global shutter and "read while integrating" function.

Such pixel circuit may comprise two further capacitors, each connected via two overflow gates to each of the two parallel capacitors and switches.

It is an advantage of embodiments of the present invention that charges not fitting in the parallel capacitors may overflow to the further capacitors.

A pixel circuit according to embodiments of the first aspect may further comprise a reset transistor connected to the floating diffusion layer.

It is an advantage of embodiments of the present invention that charges may be flushed out after integration time. It is a further advantage that any charge overflown into the FD from the storage or the capacitor node may be removed, thus reducing or avoiding blooming.

The pixel circuit according to embodiments of the first aspect may comprise at least two first transfer gates for electrically connecting the pinned photodiode to at least two storage nodes, at least two second transfer gates for electrically connecting the at least two storage nodes with at least one floating diffusion node, and at least two merging switches for connecting the at least one floating diffusion node with at least two capacitor nodes. The pixel circuit may further comprise at least two further transfer gates or fixed barriers between the pinned photodiode, or between each of the storage nodes, and each of the at least two capacitor nodes It is an advantage of embodiments of the present invention that a pipelined shutter is obtained by parallelization of the circuit, allowing photocharges to be stored and processed alternatingly through at least a first and second storage and capacitor nodes.

In a second aspect, the present invention provides a method of operation of a pixel circuit according to embodiments of the first aspect. The method comprises:

illuminating the pixel circuit, thereby integrating photocharges in the pinned photodiode, transferring an amount of charge through the at least first transfer gate into the at least one storage node, whereby charge exceeding the maximum capacity of the at least one storage node is transferred or overflown to the capacitor node, transferring the charges of the at least one storage node to at least one floating diffusion node, reading the charge in the at least one floating diffusion node.

It is an advantage of embodiments of the present invention that a global electronic shutter can be combined with linear high dynamic range, by creating multiple linear $Q_{FW}$ ranges, decreasing noise, and increasing capacity of the pixel, further reducing blooming, while at the same time utilizing most or all of the integrated photocharges.

The method according to embodiments of the second aspect may further comprise:

transferring the charges through the merging switch from the capacitor node to the floating diffusion node, and reading the charge in the at least one floating diffusion node.

It is an advantage of embodiments of the present invention that the charge can be read out using CDS.

The method according to embodiments of the second aspect may further comprise transferring the charge from the capacitor node to at least two capacitors through at least two transistors before transferring the charges from the capacitor node to the floating diffusion node.

It is an advantage of embodiments of the present invention that the capacitors may be further protected from overload.

In the method according to embodiments of the second aspect, transferring the charge to at least two capacitors may comprise transferring the charge related to a predetermined frame to one or more capacitors, and transferring the charge related to a further frame to one or more different capacitors.

It is an advantage of embodiments of the present invention that RWI can be obtained, thereby simultaneously integrating photocharges while transferring the charges from one capacitor to the FD for readout, thus increasing the speed of the pixel and increasing frame rate of the sensor.

In the method according to embodiments of the second aspect, charge that exceeds the maximum capacity of the at least one storage node may be transferred or overflown from the pinned photodiode to the capacitor node.

Charge that exceeds the maximum capacity of the at least one storage node may be transferred or overflown from the storage node to the capacitor node.

It is an advantage of embodiments of the present invention that charges are not lost, but stored for future use.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
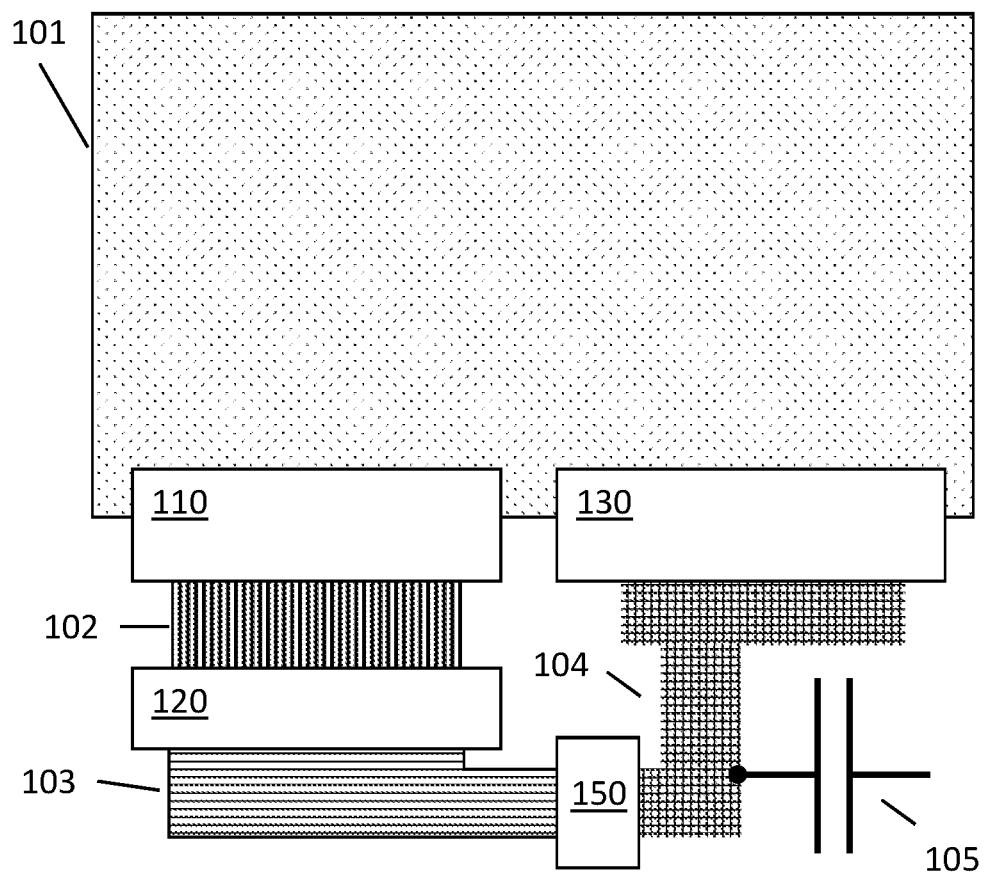
FIG. 1 illustrates a pixel according to embodiments of the present invention, comprising a storage node and a capacitor node connected to the pinned photodiode (PPD) via potential barriers

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

Detailed Description of Illustrative Embodiments

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "global shutter pixels", reference is made to pixels with a pinned photodiode, a first transfer gate from the pinned photodiode towards a storage node and a second transfer gate from the storage node towards a floating diffusion. The intention of such global shutter pixels is to realize pixels with pipelined synchronous (called "global") electronic shutter capable of performing readout with correlated double sampling (CDS), and not being limited by the relatively high dark current of a surface diode (such as a floating diffusion).

Where in embodiments of the present invention reference is made to "linear High Dynamic Range (HDR) pixels", reference is made to pixels with a pinned photodiode, a transfer gate from the pinned photodiode towards a floating diffusion, and additional storage capacitors connected to the floating diffusion via switches or overflow barriers, with the intention to create multiple linear $Q_{FW}$ ranges, resulting after linear combination in an overall high dynamic range.

Where in embodiments of the present invention reference is made to "a charge storage node", reference is made to a means for storing charges (e.g. an excess of charges) collected by the photodiode.

Where in embodiments of the present invention reference is made to "full well capacity", reference is made to the largest charge a pixel can hold (charge at full well, $Q_{FW}$) before saturation, resulting in degradation of the signal.

Where in embodiments of the present invention reference is made to "blooming" a process is referred to where the charge in a pixel exceeds the pixel's saturation level, and the charge starts to fill adjacent pixels.

Where in embodiments of the present invention reference is made to "radiation", reference is made to electromagnetic radiation of any type, e.g. visible light, UV light, infra-red light, X-rays, gamma rays. Alternatively, the impinging radiation may be particles, including low or high energy electrons, protons, hadrons or other particles. Hence, in the context of the present invention, charges can be photocharges or particle charges. If in embodiments of the present invention, only photocharges are mentioned, this is not intended to be limiting for the invention, but this is done for the purpose of illustration only.

In a first aspect, the present invention relates to a pixel circuit with a high dynamic range and variable (e.g. high) charge at full well ($Q_{FW}$).

In embodiments of the present invention, a pixel circuit comprises a pinned photodiode (PPD), and at least one of each of the following: a floating diffusion node (FD), a capacitor node and a storage node. The storage node is connected to the PPD and the FD via a first and second transfer gates (TG), respectively. The capacitor node is connected to at least one capacitor, and it may be connected to either the PPD or the storage node by a potential barrier, for example by a third TG or by a barrier such as a transistor gate, a multi-level gate (e.g. a DC gate), or by a fixed barrier, e.g. a passive potential barrier as disclosed in US2014263947A1, incorporated herein by reference. The capacitor node is adapted for receiving charges that would otherwise surpass the maximum storage capacity of the storage node. Thus, the capacitor node may be connected to the storage node via an overflow barrier, fixed or variable, and charges that surpass the maximum storage of the node thus overflow to the capacitor node. Alternatively, the node may be connected directly to the PPD via an overflow barrier, so when the storage node reaches its maximum charge, the photocharges of the PPD overflow to the capacitor node. Disadvantageous effects such as blooming of the PPD or charge drain to substrate can be reduced or avoided, because the charge storage capacity of the PPD is increased thanks to the connection to the capacitor node. Finally, the capacitor node and the FD are connected via a merging switch, for merging charges stored on the capacitor node and the FD. This gives the additional advantage of better utilization and readout of generated charges, with no need of flushing them out of the pixel and losing them. The merging switch may be a multi-level gate, e.g. a transistor gate that can be set to at least 2 DC levels, or may be a transfer gate (merging transfer gate).

The first and second TGs can be a multi-level transfer gate, for example comprising an OFF level, an ON level, and an intermediate level wherein the transfer gate is an overflown variable barrier.

The first and second TGs and the merging switch are not limited to the present examples, and may be any suitable type of switch, selective barrier, etc. Likewise, between the capacitor node and the PPD or the storage node, other suitable barriers, variable or not, may be used. This confers the pixel circuit a broad selectivity of $Q_{FW}$.

The storage node may be advantageously integrated within the substrate of the pixel; for example, it may be a pinned storage node, a surface or buried channel storage gate comprising an inversion layer (e.g. a CCD topology).

In some embodiments of the present invention, the capacitor node may comprise a capacitor set. For example, it may be connected to two or more capacitors. For example, the connection can be done via switches, transistors, etc. These can be used for increasing versatility of the storage capacity, for example to increase it in a controlled way, and/or for storing charges of different exposures or frames. For example, separately storing odd and even frames helps to realize full global shutter, also called RWI "read while integrating": while one capacitor stores and allows readout of the information of one frame, the other capacitor can already accept charges from the next frame or integration time. Further capacitors may be connected to the first one via (fixed or variable) overflow gates, allowing charges not fitting in the first capacitor to overflow to the further ones.

By "capacitor" is understood a charge storage device in the general sense. In some embodiments of the present invention, MIM or MOS structures can be used. For example, transistors or transistor gates can be used for charge storage.

In some embodiments, a RESET switch may be connected to the FD. For example, it may be used for resetting the FD between subsequent readings of a first and second capacitors in the capacitor node. Other elements may be included in a pixel circuit according to embodiments of the present invention, for example further RESET switches for resetting nodes (charge and/or capacitor nodes), and/or a readout circuit, e.g. a source follower, connected to the FD for readout of the voltage level.

Some or all components of a pixel according to embodiments of the present invention may comprise semiconductors (Si, Ge, InGaAs, etc.), doped semiconductors, dielectrics and oxides (e.g. silicon oxide, etc.), metal contacts, etc. These materials may be arranged, according to the function of the component they are part of, in several configurations, for example: metal-insulator-metal or metal-insulator-semiconductor structures, metal-oxide-semiconductor (MOS) structures, physical barriers or doped barriers for capacitors, gates and/or switches (e.g. transistors), areas with photoelectric material (e.g. PPD), conductive channels (e.g. by providing a metal wire or strip wire, semiconductor degeneration, etc.); areas for charge storage and FD, and such. Some or all of these components can be obtained via standard semiconductor processing, for example in semiconductor wafers, by deposition, by lithography, etc.

Exemplary embodiments will be described with reference to the attached figures. In the figures, active areas (e.g. photodiode, sources, drains) are patterned, while barriers (e.g. transistor gates, transfer gates, fixed barriers) are represented with a white box.

FIG. 1 shows an implementation of a pixel according to embodiments of the present invention, with a pinned photodiode (PPD) 101 connected, via a first transfer gate (TG) 110, to a storage node 102. The storage node is connected to the floating diffusion (FD) 103 via a second TG 120. A capacitor node 104 is connected to the PPD 101 via a fixed or variable barrier 130, which may be for example a transistor gate or any other suitable barrier. The relative position of the barrier 130 and capacitor node 104 depends on design and specific layout of the pixel, and it does not need to be next to the first transfer gate 110. The capacitor node 104 is further connected to a capacitor 105. A merging switch 150 (such as a transistor gate) connects the FD and the capacitor node, suitable for merging the charges of the capacitor 105 in the FD. The TGs 110, 120 and, optionally, the variable barrier 130 (in those embodiments in which the barrier 130 between the capacitor node and the PPD is variable) may be set to any of two states (ON or OFF, allowing or blocking the flow of charges) or to three or more states (ON, OFF and at least one further overflow intermediate state, in which only charges over a pre-determined charge threshold are allowed to flow). This can be obtained by transistors, transfer gates, DC gates, etc. Further connections (not pictured) may be included, e.g. to voltage sources, groundings, etc.

Figure 2:
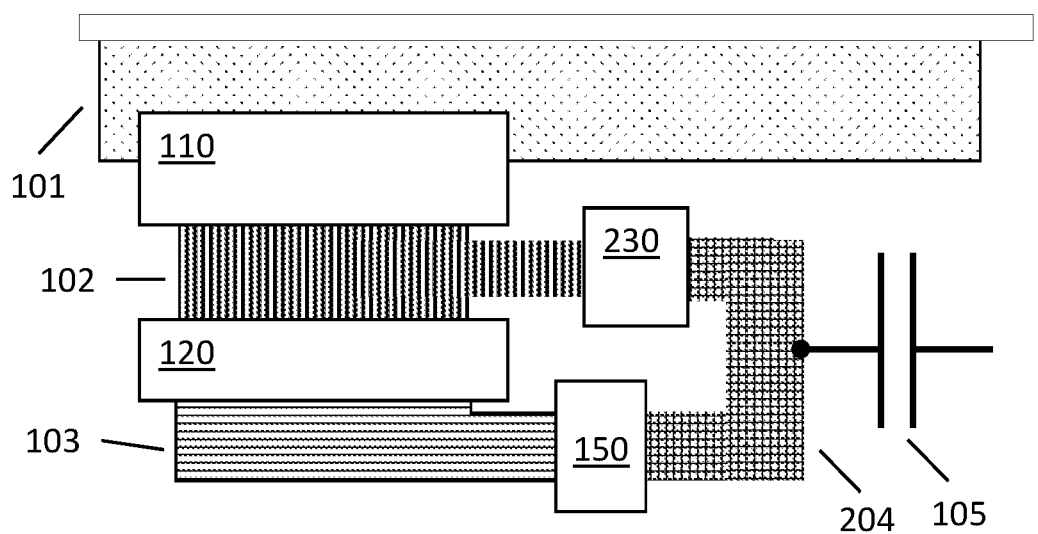
FIG. 2 illustrates an alternative embodiment of a pixel according to embodiments of the present invention, comprising a storage node connected to the PPD and a capacitor node connected to the storage node via potential barriers.

FIG. 2 shows an alternative embodiment of a pixel circuit according to embodiments of the present invention, with the capacitor node 204 not being connected via a variable barrier to the PPD as in FIG. 1, but with the capacitor node 204 connected to the storage node 102 through a barrier 230 (e.g. a passive potential barrier, a transfer gate, etc.). The potential of the barrier 203 may be advantageously lower than the potential of the second TG 120, allowing charges first to overflow from the storage node 102 to the capacitor node 204 instead of to the FD or to any surrounding substrate (e.g. in integrated device), hereby reducing blooming and other parasitic effects.

The capacitor node is adapted to relieve charges from the PPD by overflow of charges, either from the charge storage node connected to the PPD (thus allowing more charges to be transferred from the PPD to the storage node), or directly from the PPD. This can be chosen depending on design needs, compactness, etc. In some embodiments, the capacitor node is placed at least partially on top of the PPD, for example as a MOS structure. The overflow may be regulated by a fixed barrier or, in some embodiments, by a variable barrier, in which case the barrier may be set high or low, depending on the environmental circumstances, the particular application of the pixel, etc. The overflown charge is not lost, and it can be read out by sending it to the FD, for example through a switch or further gate.

Figure 3:
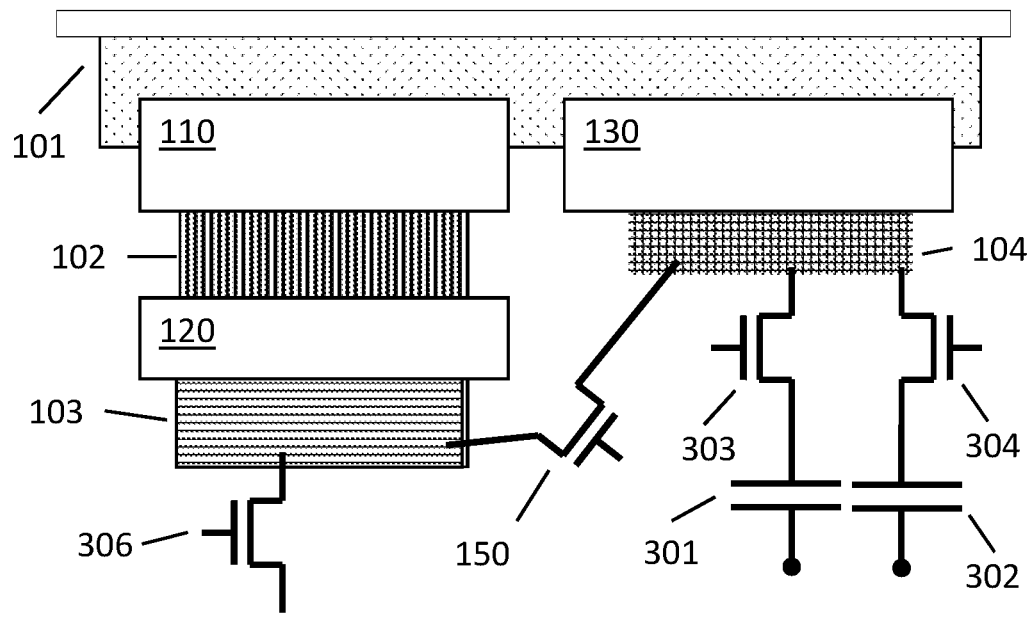
FIG. 3 illustrates an embodiment of a pixel comprising the topology of FIG. 1, further comprising a first couple of capacitors in parallel connected to the capacitor node via switches.

FIG. 3 shows an alternative embodiment of a pixel circuit according to embodiments of the present invention, in which the capacitor node 104 is connected to a plurality of, in the embodiment illustrated two, capacitors 301, 302 in parallel, via one switch 303, 304 each. The merging switch 150 between the FD 103 and the capacitor node 104 is represented here as a transistor for simplification only. This is not intended to mean that in these embodiments the merging switch is required to be a transistor. A further switch 306, or "reset switch", may connect the FD to a voltage VDD for resetting the FD to a start value when required.

Figure 4:
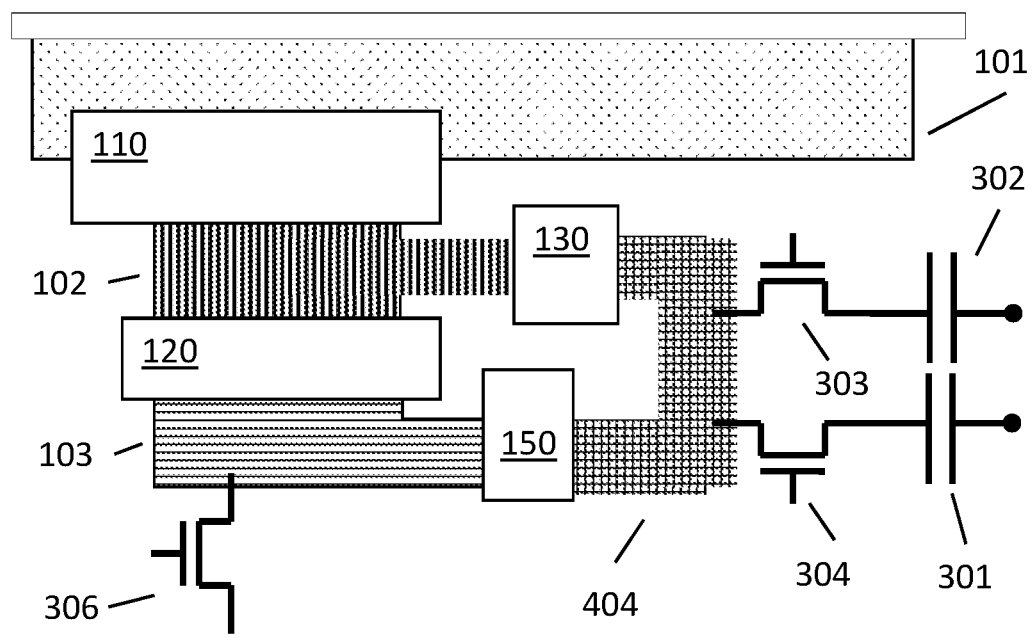
FIG. 4 illustrates an embodiment of a pixel comprising the topology of FIG. 2, further comprising two capacitors in parallel connected to the capacitor node via switches.

FIG. 4 shows an embodiment of a pixel circuit according to embodiments of the present invention, in which the couple of capacitors 301, 302 coupled in parallel and the switches 303, 304 of FIG. 3 are connected to a capacitor node 404 in a topology as in FIG. 2, and a reset switch 306 is also connected to FD as before in FIG. 3.

Figure 5:
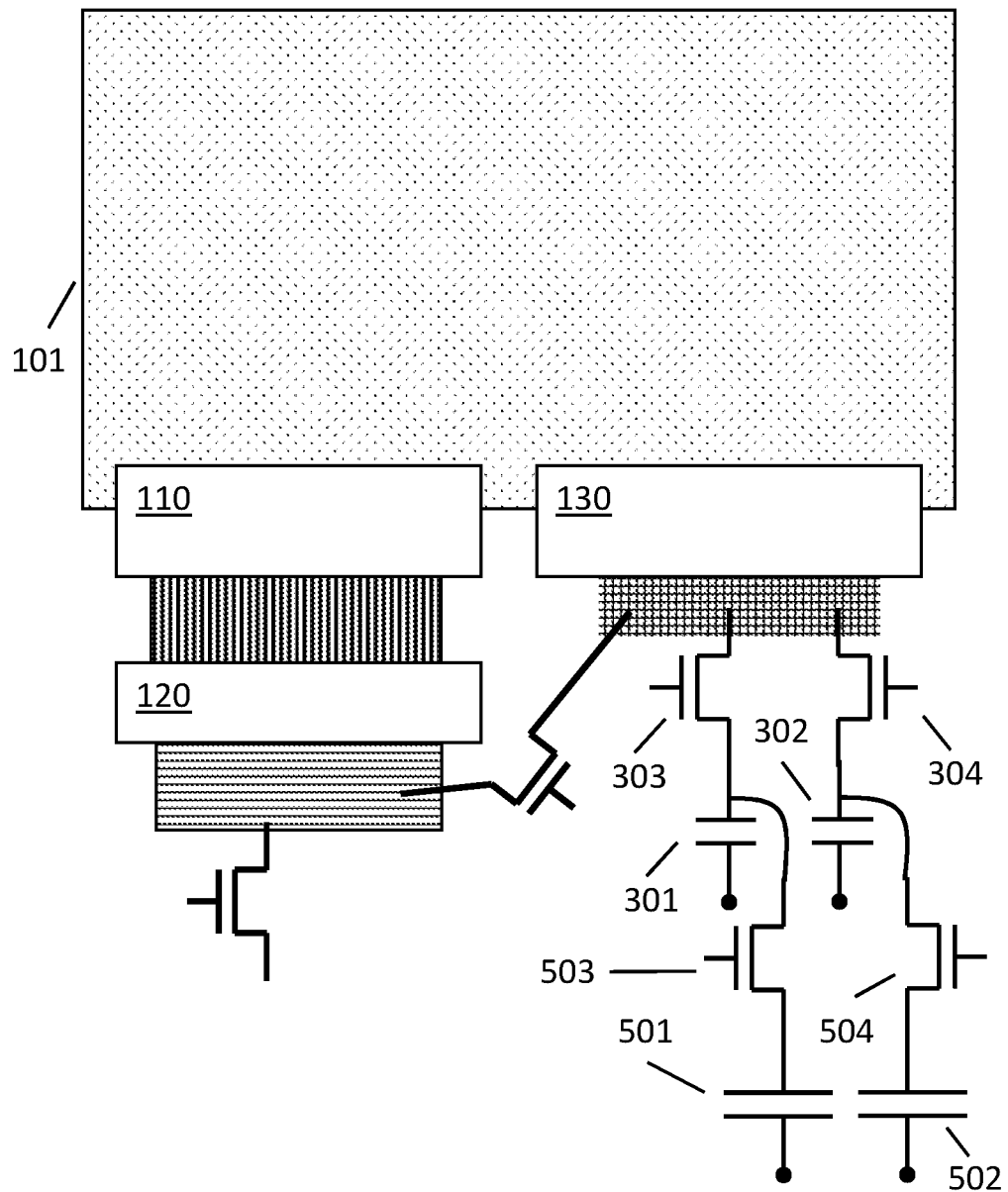
FIG. 5 illustrates an embodiment of a pixel according to the topology of FIG. 3, further comprising a further couple of switches and capacitors connected to the first couple of capacitors.

FIG. 5 shows an embodiment as in FIG. 3 in which a further plurality of capacitors 501, 502 is connected between the plurality of capacitors 301, 302 and their corresponding switches 303, 304. Preferably one further capacitor 501, 502 may be connected between each capacitor 301, 302 and its corresponding switch 303, 304. A couple of switches or barriers 503, 504 are added so the capacitors 301, 302 do not overcharge, allowing the extra charges to pass through and be stored in the further capacitors 301, 302.

When the pixel comprises a plurality of capacitors, each of them may have a different value of capacitance. For example, a set of capacitors may be used under a predetermined illumination intensity, and a second set, with higher capacitance, may be used if the intensity threshold is surpassed. In other embodiments, all capacitors may be equivalent and in case of failure of one, another one can be used instead.

Other embodiments may comprise different capacitor connection types, for example capacitors connected in series, for example via a switch, for a selective capacitance and increase of $Q_{FW}$.

The capacitors can be sequentially filled and discharged. In some embodiments, a set of MOS structures (e.g. transistor gates, transistors) can be connected in series with the FD and with the capacitor node. These MOS structures acting as capacitors may have increasing channel lengths, the shortest being closest to the FD connection. This way, all photo charge can be integrated under all MOS capacitors during FD potential readout, then opening the merging switch and allowing to sequentially turn off the furthest MOS capacitor, thereby pushing the charge underneath back into the smaller capacitors, thus gradually pushing the charge towards the FD for readout.

Figure 6:
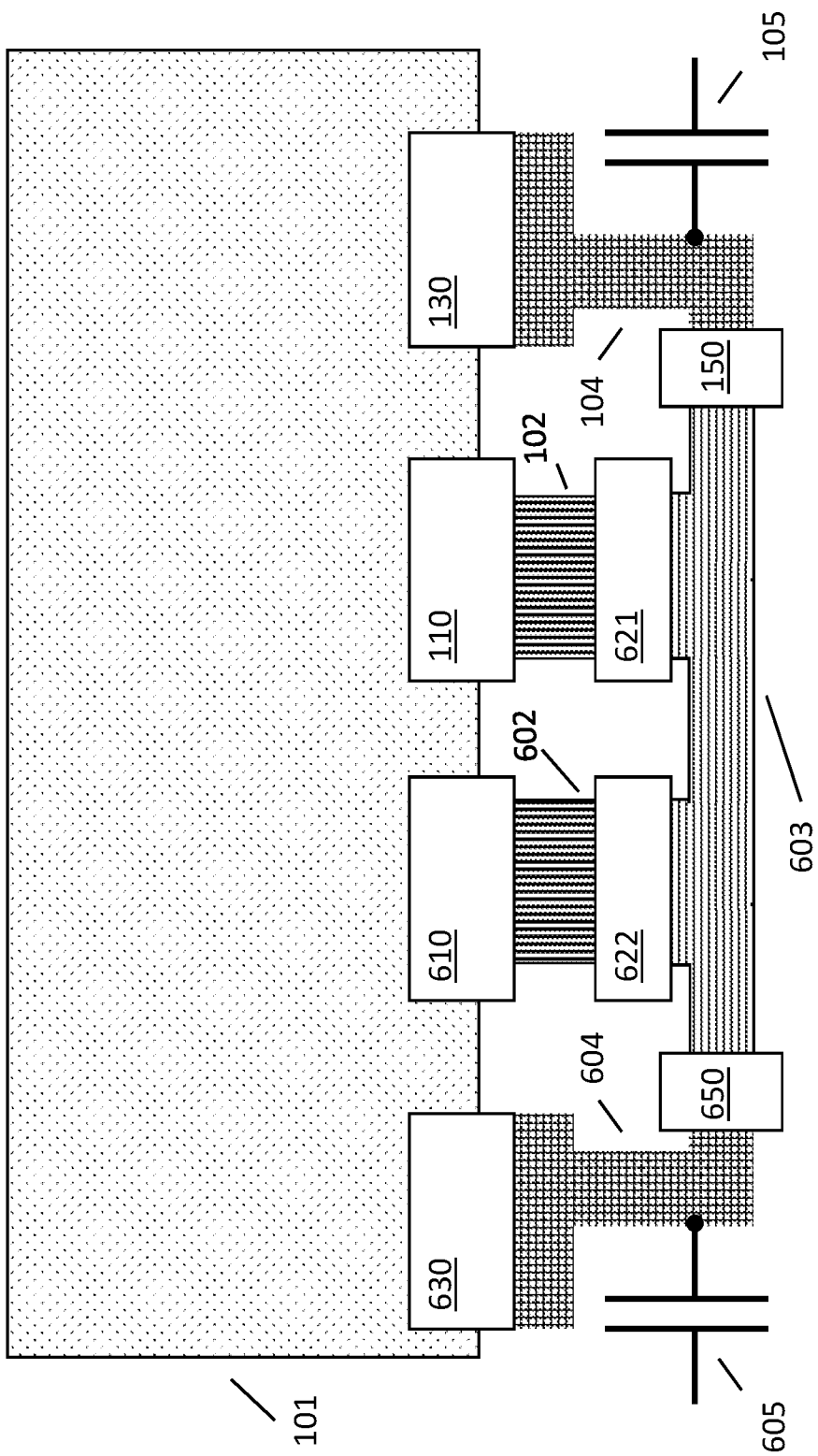
FIG. 6 illustrates an embodiment of a pixel according to the present invention, comprising a single PPD and a single FD, further comprising a couple of storage nodes and capacitor nodes connected to the PPD via potential barriers.
Figure 7:
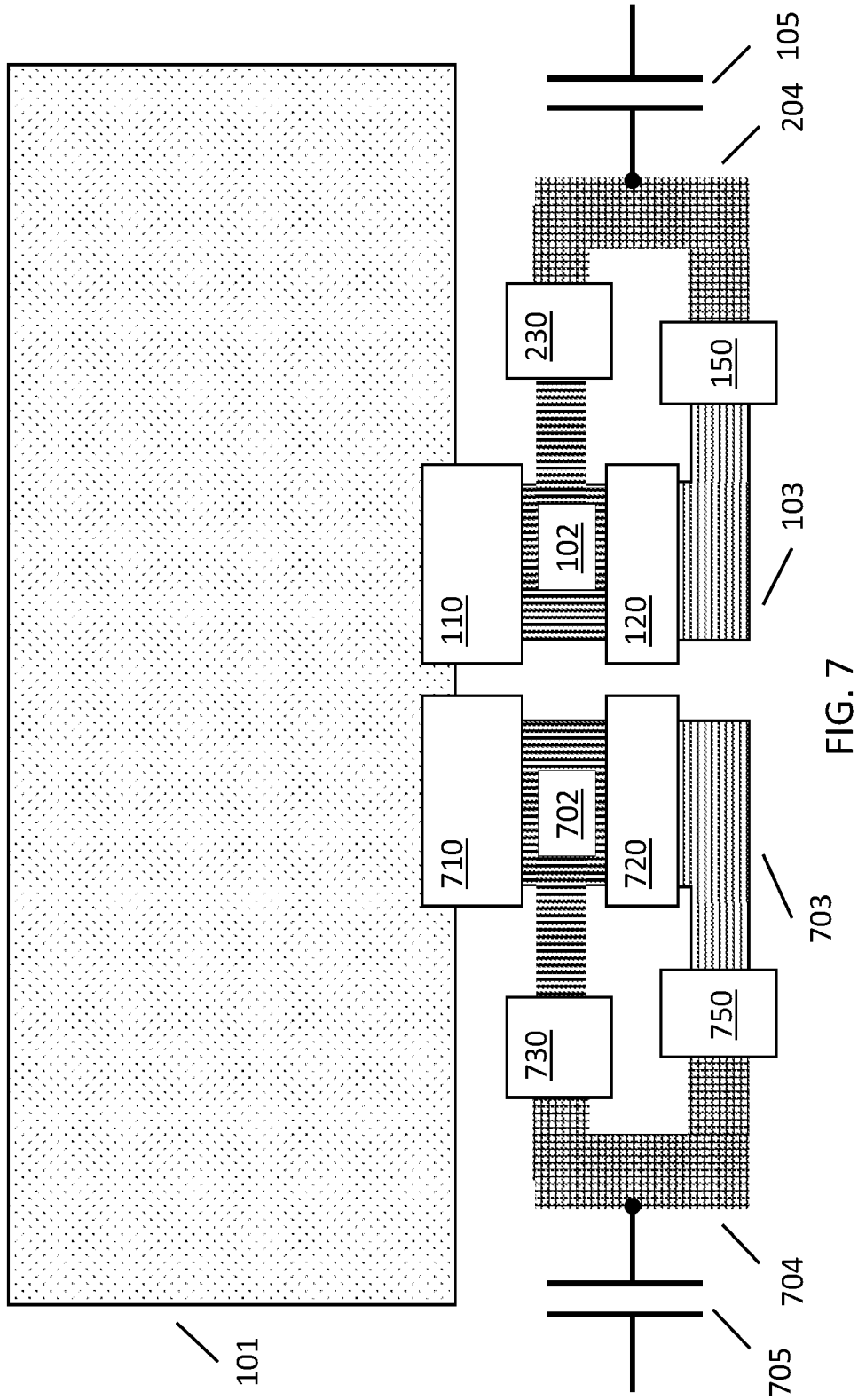
FIG. 7 illustrates an embodiment of a pixel according to the present invention comprising a single PPD, and further comprising a couple of storage nodes connected to the PPD via potential barrier, a couple of FDs and a couple of capacitor nodes each connected to a respective storage node via potential barriers.

FIG. 6 and FIG. 7 show embodiments of pixel circuits according to the present invention, comprising a pinned photodiode 101, two capacitor nodes 104, 604; 204, 704 and two storage nodes 102, 602; 102, 702. Charge of the PPD 101 may be stored in both branches and be read in a unique FD 603 (FIG. 6), or in two FDs 103, 703, one for each branch (FIG. 7). This parallelized topology allows "pipelined shutter", allowing photocharge of alternating frames or integration times to be alternatively stored in one branch or another, thus increasing readout flexibility and dynamic range.

FIG. 6 shows and embodiment with two storage nodes 102, 602 connected to the PPD 101 via a first couple of TGs 110, 610. Both storage nodes 102, 602 are further connected to a unique FD 603 via a second couple of TG 120, 620. Each capacitor node 104, 604 is connected to a capacitor 105, 605 in each branch, and they are further connected to the PPD 101 by two potential barriers 130, 630 which may be any of a gate, a fixed barrier such a passive potential barrier. The capacitor nodes 104, 604 and the FD 603 are connected via two merging switches 150, 650 of any suitable type.

FIG. 7 shows the two storage nodes 102, 702 connected to the PPD 101 via a first couple of TGs 110, 710. Both storage nodes 102, 702 are further connected to a corresponding (separate) FD 103, 703 in each branch, via a second couple of TG 120, 720. This allows two readouts per pixel. Each capacitor node 204, 704 is connected to a capacitor 105, 705 in each branch, and to the storage node as in FIG. 2 and FIG. 4, by two potential barriers 230, 730 (which may be any suitable barrier, e.g. a variable or fixed potential barrier). The capacitor nodes 204, 704 and the FDs 103, 703 are connected, respectively, via two merging switches 150, 750 of any suitable type.

The present invention is not limited to one or two storage nodes and one or two capacitor nodes, and more than two of each may be connected to the photodiode.

Figure 8:
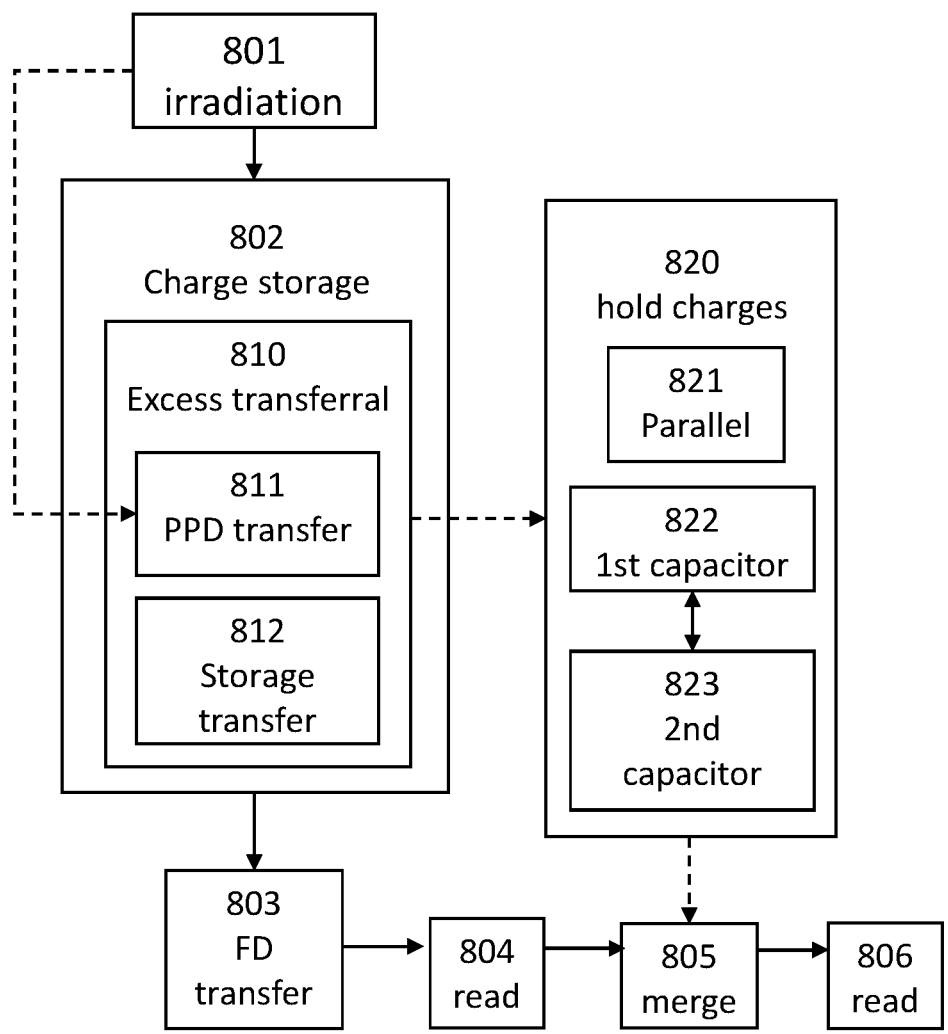
FIG. 8 illustrates a flowchart illustrating methods according to embodiments of the present invention.

In a second aspect, the present invention relates to a method for operating a pixel circuit according to embodiments of the first aspect of the present invention. In embodiments of the second aspect, as illustrated in the flowchart of FIG. 8, the method comprises illuminating 801 the pixel circuit (i.e. irradiating the pixel circuit), hence producing photocharges (or particle charges) that are integrated in a pinned photodiode. Then, charges are transferred 802 through the first TG into the storage node. If the charge reaching the storage node exceeds its maximum charge allowed, in order to avoid parasitic currents, blooming and other disadvantageous effect, the exceeding charge is transferred 810, either by overflow or through a TG or a transistor gate, to the capacitor node. The charge may be transferred 811 directly from the PPD (even during integration, if the charges surpass the barrier), or it may be transferred 812 from the storage node. Either way, the PPD may be depleted without losing charges exceeding the maximum charge allowed in the storage node. Any charge transferred to the capacitor node may be held 820 in a capacitor. This allows, for example, reading the charges using Correlated Double Sampling (CDS). The method further comprises transferring 803 the charges from the storage node to a FD through the second TG, wherein the charges (or a representative magnitude, such as a voltage or current) are read 804 by, e.g., a readout circuit. The method may further comprise transferring 805 the charges from the capacitor node to the FD through the merging switch (e.g. by closing the switch), and reading 806 the charge in the FD. It is an advantage of embodiments of the present invention that the charge in full well ($Q_{FW}$) may be linearly increased.

Other steps may be included. For instance, holding 820 the charge in a capacitor may comprise holding 821 the charge in a plurality of capacitors in parallel. Optionally or additionally, the charge may be alternatively transferred to a plurality of capacitors. For example, they may be transferred 822 to one capacitor or transferred 823 to a second capacitor, using switches, for alternate frames. For example, for odd frames, the charges may be transferred 822 to a first capacitor, and for even frames, the charges may be transferred 823 to a second capacitor. The read-out may follow a similar assignment, and the charges from a first capacitor may be transferred 805 to the FD by opening the first switch and the merging switch, while the charges from a second capacitor may be transferred 805 to the FD by opening the second switch and the merging switch.

In the following, the method of the second aspect of the present invention is applied to pixel topologies of the first aspect of the present invention.

In a method applied to the topology shown in FIG. 1, the photocharges (or particle charge) may be integrated in the pinned photodiode 101 (e.g. due to exposure to radiation such as light). Then, the first TG 110 is pulsed, thereby transferring charge into the storage node 102, as far as charge fits therein. Then the barrier 130 may be pulsed, so that charge still remaining in the PPD 101 is transferred to the capacitor node 104 and into the capacitor 105. Alternatively, if the barrier 130 is a fixed potential barrier, or a transfer gate biased as a fixed potential barrier, charges that do not fit the PPD 101 may overflow to the capacitor node 104 during the integration time, i.e. even before the TG 110 is pulsed.

Afterwards, charges may be transferred from the storage node 102 to the FD 103 by closing the second TG 120, so the charge in the storage node can be read out, for example using CDS. Finally, the charge in the capacitor node 104 can also be read out on the FD 103 by closing the merging switch 150 (e.g. merging transistor) and transferring the charges from the capacitor node 104 to the FD 103. The order of steps can be changed, and the charges in the capacitors may be read before the charges in the storage node.

In a method applied to the topology shown in FIG. 2, photocharges (or particle radiation charges as equivalent wherever this term is used) may be integrated in the pinned photodiode 101. Then, when pulsing the first TG 110, charge is transferred into the storage node 102, whereby, if the charge surpasses the maximum capacity of the storage node, it overflows the potential set by the barrier or TG or transistor 230 into the capacitor node. This barrier 230 may be a fixed potential barrier, for example a doped region, or a variable barrier, for example a transistor or transfer gate, as before.

Afterwards, the procedure is similar to the one followed for the previous topology of FIG. 1: transferal of charges from the storage node 102 to the FD 103 by closing the second TG 120, readout (optionally using CDS), and readout of charges in the capacitor node 204 by closing the merging switch 150 between the FD 103 and the capacitor node 204.

In a method applied to the topology shown in FIG. 3 and FIG. 5, the photocharge is integrated in the PPD 101, then when pulsing the first TG 110, charge is transferred into the storage node, up to its actual maximum capacity. Then the TG 130 is pulsed so that charge still remaining in the PPD, if any, is transferred to one of the plurality of capacitor nodes. For example, charges from odd frames may be transferred to a first capacitor 301 and charges from even frames to a second capacitor 302, via corresponding switches 303, 304. More elaborate assignment of capacitor (nodes) to frame sequences may be applied.

Afterwards, as before, the charge in the storage node 102 can be read out on the FD using, e.g., CDS, and the charge in the various capacitor nodes is read out on the FD 103 by closing the merging switch 150 and the appropriate switch 303, 304 connecting to each capacitor node 301, 302. For example, the reading may be done alternatively, opening the merging switch 150 and each of the switches 303, 304, one by one following a predetermined timing, or all combined. Charges left in the floating diffusion may be removed by appropriately actuating the reset switch 306.

In a method applied to the topology shown in FIG. 4, the photocharges in the PPD 101 are transferred into the storage node 102 (e.g. by pulsing the first TG 101), whereby, if the charge does not fit in the storage node 102, it overflows the barrier set by the TG 130 into the capacitor node 404, into one more than one capacitors 301, 302, for instance, one capacitor for odd and another for even frames. As before, a more elaborate assignment of capacitors to frame sequences may be used, up to even making a short sequence of images or a short movie.

Afterwards, the charge in the storage node 102 and in the capacitor nodes 301, 302 may be read in the FD 103 as before, either following an assignment or all combined.

In general, if any charge remains in the PPD at the end of the integration time, a further step of transferring the charges to the storage node 102 and to the FD may be added, for example by pulsing the first and second gates.

In a method applied to the topology shown in FIGS. 6 and 7, pipelined shutter is obtained by parallelization of the storage and capacitor nodes, alternating the transferal of the photocharges integrated in alternating frames towards one or another branch. In case of FIG. 6, the photocharges in the PPD 101 are alternatively transferred into the storage nodes 102, 602 (e.g. by pulsing the first TG 101, 601), depending on the frame. For example, odd frames may transfer the photocharges to a first storage node 102, while even frames may transfer them to a second storage node 602. If the charge does not fit in the storage node 102, it may overflow the barrier set by the barriers 130, 630 into the capacitor node 104, 604 into one more than one capacitors 105, 605, for instance, one capacitor for odd and another for even frames.

Afterwards, the charge in the storage nodes 102, 602 and in the capacitor nodes 105, 605 may be alternatively read in the FD 603 as before, either following a pre-determined assignment (first, charges collected in an odd frame; then, charges collected during an even frame) or all combined. Other possibilities, such as the use of transistors with increasing channel length in series, can be used as a set of capacitors with different capacitance. For example, the charge accumulated can be sent to the FD after integration by turning OFF the transistors in sequence towards the FD.

Instead of a single FD, two or more FDs 103, 703 may be used, as shown in FIG. 7, allowing independent readout of charges collected during sequential frames.

The present invention has been described in the framework of pixel circuits and image sensors, but it is not limited to visible radiation and it may be applicable to other types of radiation, such as corpuscular radiation, X-rays, infrared, etc. Likewise, the present invention is not limited to the disclosed features, for example instead of a pinned photodiode with a buried layer, other topologies of photoelectronic pixels or sensors may be used.

The invention claimed is:

1. An image sensor comprising one pinned photodiode, at least one first transfer gate for electrically connecting the pinned photodiode to at least one storage node, at least one second transfer gate for electrically connecting the at least one storage node with at least one floating diffusion node, and at least one merging switch for connecting the at least one floating diffusion node with at least one capacitor node that accepts for accepting any charge that exceeds the maximum capacity of the storage node.

2. The image sensor according to claim 1, further comprising at least one third transfer gate for electrically connecting the pinned photodiode and the at least one capacitor node.

3. The image sensor according to claim 1, further comprising at least one fixed barrier between the pinned photodiode and the at least one capacitor node.

4. The image sensor according to claim 1, further comprising at least one third transfer gate for electrically connecting the storage node and the at least one capacitor node.

5. The image sensor according to claim 1, further comprising at least one fixed barrier between the storage node and the at least one capacitor node.

6. The image sensor according to claim 1, wherein the merging switch is a transistor gate that can be set to at least 2 DC levels.

7. The image sensor according to claim 1, wherein the merging switch is a merging transfer gate.

8. The image sensor according to claim 1, wherein any transfer gate can be set to at least three different levels comprising an OFF level, an ON level, and an intermediate level wherein the transfer gate is an overflown variable barrier.

9. The image sensor according to claim 7, wherein the merging transfer gate can be set to at least three different levels comprising an OFF level, an ON level, and an intermediate level wherein the transfer gate is an overflown variable barrier.

10. The image sensor according to claim 1, wherein the at least one capacitor node comprises a pair of capacitors in parallel configuration, each capacitor connected to the capacitor node via a switch.

11. The image sensor according to claim 10, comprising two further capacitors each connected via two overflow gates to each of the two parallel capacitors and switches.

12. The image sensor according to claim 1, further comprising a reset transistor connected to the floating diffusion node.

13. The image sensor according to claim 1, comprising two first transfer gates for electrically connecting the pinned photodiode to two storage nodes, two second transfer gates for electrically connecting the two storage node with the at least one floating diffusion node, and two merging switches for connecting the at least one floating diffusion node with two capacitor node, and further comprising two further transfer gates or fixed barriers between the pinned photodiode and each of the two capacitor nodes.

14. The image sensor according to claim 1 comprising two first transfer gates for electrically connecting the pinned photodiode to two storage nodes, two second transfer gates for electrically connecting each storage node with the at least one floating diffusion node, and two merging switches for connecting the at least one floating diffusion node with two capacitor nodes, and further comprising two further transfer gates or fixed barriers between each of the two storage nodes and each of the two capacitor nodes.

15. A method of operation of the image sensor according to claim 1, the method comprising:
  illuminating the image sensor, thereby integrating photocharges in the pinned photodiode,
  transferring an amount of charge through the at least first transfer gate into the at least one storage node,
  whereby any charge exceeding the maximum capacity of the at least one storage node is transferred to the capacitor node,
  opening the at least second transfer gate, thereby transferring the charges of the at least one storage node to the at least one floating diffusion node, and
  reading the charge in the at least one floating diffusion node.

16. The method according to claim 15, further comprising:
  transferring the charges through the merging switch from the capacitor node to the floating diffusion node, and
  reading the charge in the at least one floating diffusion node.

17. The method according to claim 16, further comprising transferring the charge from the capacitor node to at least two capacitors through at least two transistors before transferring the charges from the capacitor node to the at least one floating diffusion node.

18. The method according to claim 17, wherein transferring the charge to at least two capacitors comprises transferring the charge to one or more capacitors for a predetermined frame, and transferring the charge to one or more different capacitors for a further frame.

19. The method according to claim 15, wherein any charge that exceeds the maximum capacity of the at least one storage node is transferred from the pinned photodiode to the capacitor node.

20. The method according to claim 15, wherein any charge that exceeds the maximum capacity of the at least one storage node is transferred from the storage node to the capacitor node.

* * * * *